US006301175B1

(12) United States Patent
Seyyedy et al.

(10) Patent No.: US 6,301,175 B1
(45) Date of Patent: Oct. 9, 2001

(54) MEMORY DEVICE WITH SINGLE-ENDED SENSING AND LOW VOLTAGE PRE-CHARGE

(75) Inventors: Mirmajid Seyyedy; Brian M. Shirley, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/626,215

(22) Filed: Jul. 26, 2000

(51) Int. Cl.[7] .................................................. G11C 7/00
(52) U.S. Cl. ........................ 365/203; 365/149; 365/207
(58) Field of Search ..................................... 365/203, 202, 365/204, 208, 222, 149, 207

(56) References Cited

U.S. PATENT DOCUMENTS

| Re. 35,825 | 6/1998 | Zagar ..................... 365/226 |
|---|---|---|
| 4,598,389 | 7/1986 | Duvvury et al. ............... 365/208 |
| 4,625,300 | 11/1986 | McElroy ........................ 365/205 |
| 4,715,015 | * 12/1987 | Mimoto et al. ............... 365/149 |
| 4,792,922 | 12/1988 | Mimoto et al. ............... 365/149 |
| 4,823,031 | 4/1989 | Kadakia ........................ 307/530 |
| 4,980,862 | * 12/1990 | Foss .............................. 365/203 |
| 5,013,943 | 5/1991 | Hirose ........................... 307/530 |
| 5,038,324 | 8/1991 | Oh ............................. 365/189.01 |
| 5,042,011 | 8/1991 | Casper et al. .................. 365/205 |
| 5,122,986 | 6/1992 | Lim et al. ................... 365/189.11 |
| 5,220,221 | 6/1993 | Casper .......................... 307/530 |
| 5,241,503 | * 8/1993 | Cheng ........................... 365/205 |
| 5,295,100 | 3/1994 | Starkweather et al. . |
| 5,303,196 | 4/1994 | Sang et al. .................... 365/206 |
| 5,309,392 | 5/1994 | Ootsuka et al. ............... 365/145 |
| 5,351,215 | 9/1994 | Tanabe ........................... 365/203 |
| 5,357,468 | 10/1994 | Satani et al. ................ 365/189.01 |
| 5,367,213 | 11/1994 | Casper ............................ 327/56 |
| 5,367,481 | * 11/1994 | Takase et al. ................. 365/149 |
| 5,369,317 | 11/1994 | Casper et al. .................. 326/87 |

(List continued on next page.)

FOREIGN PATENT DOCUMENTS

| 59-139196 | 8/1984 | (JP) | ................... G11C/11/37 |
| 62-184691 | 8/1987 | (JP) | ................... G11C/11/34 |
| 5-94692 | 4/1993 | (JP) | ................... G11C/11/401 |

OTHER PUBLICATIONS

Eto, S., et al., "A 1–Gb SDRAM with Ground–Level Precharged Bit Line and Nonboosted 2.1–V Word Line", *IEEE Journal of Solid–State Circuits,* 33 (11), pp. 1697–1701, (1998).

Tsukude, M., et al. "TP: A 1.2V to 3.3V Wide–Voltage–Range DRAM with 0/8V Array Operation", *IEEE International Solid–State Circuits Conference,* pp. 46, 41, 66, 67, (1997).

*Primary Examiner*—David Nelms
*Assistant Examiner*—Gene N. Auduong
(74) *Attorney, Agent, or Firm*—Schwegman, Lundberg, Woessner & Kluth, P.A.

(57) ABSTRACT

A dynamic memory has one digit line in place of two digit lines for sensing charges stored on memory cell capacitors. The memory device uses a low digit line pre-charge voltage to allow for a low supply voltage memory. In particular, one memory device embodiment uses sense amplifier nodes to provide a pre-charge supply to the digit line that is approximately a transistor threshold voltage above ground potential. By using the low pre-charge voltage, the memory device does not require boosted word line and isolation control voltages.

31 Claims, 9 Drawing Sheets

U.S. PATENT DOCUMENTS

| | | | |
|---|---|---|---|
| 5,369,622 | 11/1994 | McLaury | 365/233 |
| 5,402,378 | 3/1995 | Min et al. | 365/202 |
| 5,444,662 | 8/1995 | Tanaka et al. | 365/203 |
| 5,487,043 | 1/1996 | Furutani et al. | 365/203 |
| 5,506,811 | 4/1996 | McLaury | 365/233 |
| 5,602,785 | 2/1997 | Casper | 365/189.11 |
| 5,608,668 | 3/1997 | Zagar et al. | 365/149 |
| 5,614,856 | 3/1997 | Wilson et al. | 327/170 |
| 5,625,588 * | 4/1997 | Seyyedy et al. | 365/149 |
| 5,636,170 | 6/1997 | Seyyedy | 365/205 |
| 5,657,266 | 8/1997 | McLaury | 365/149 |
| 5,677,878 | 10/1997 | Shirley et al. | 365/189.11 |
| 5,684,749 * | 11/1997 | Seyyedy et al. | 365/203 |
| 5,719,813 | 2/1998 | Seyyedy | 365/205 |
| 5,726,931 | 3/1998 | Zagar et al. | 365/149 |
| 5,754,478 | 5/1998 | Morgan et al. | 365/189.01 |
| 5,768,178 | 6/1998 | McLaury et al. | 365/149 |
| 5,768,202 | 6/1998 | Raad | 365/207 |
| 5,796,666 | 8/1998 | Shirley et al. | 365/205 |
| 5,844,833 | 12/1998 | Zagar et al. | 365/149 |
| 5,856,939 | 1/1999 | Seyyedy | 365/149 |
| 5,866,928 | 2/1999 | Sick | 257/296 |
| 5,875,141 | 2/1999 | Shirley et al. | 365/207 |
| 5,889,718 | 3/1999 | Kimamoto et al. | 365/210 |
| 5,894,444 | 4/1999 | Seyyedy | 365/205 |
| 5,905,686 | 5/1999 | Raad | 365/207 |
| 5,923,592 | 7/1999 | Morgan et al. | 365/189.01 |
| 5,940,339 | 8/1999 | Shirley et al. | 365/207 |
| 5,949,730 | 9/1999 | Shirley et al. | 365/207 |
| 6,066,870 | 5/2000 | Sick | 257/296 |
| 6,081,461 | 6/2000 | Shirley et al. | 365/190 |
| 6,122,211 | 9/2000 | Morgan et al. | 365/205 |
| 6,134,157 | 10/2000 | Takeuchi et al. | 365/200 |

* cited by examiner

FIG. 2A  EQ
FIG. 2B  ISO A
FIG. 2C  ISO B
FIG. 2D  WORD LINE 108
FIG. 2E  DIGIT LINES
FIG. 4A  ISO EQUIL
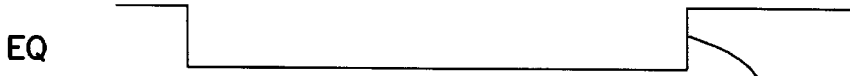
FIG. 4B  EQ
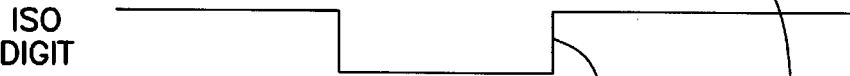
FIG. 4C  ISO DIGIT
FIG. 4D  WORD LINE 130
FIG. 4E  SENSE AMP NODES
FIG. 4F  DIGIT LINE 124
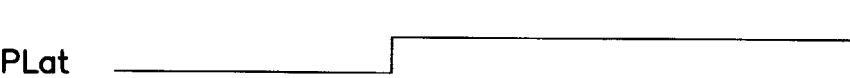
FIG. 4G  PLat
FIG. 4H  NLat

FIG. 5A   EQ
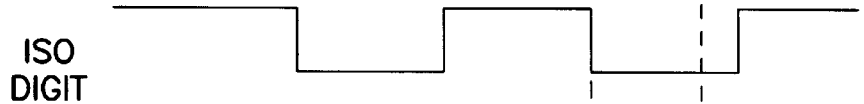
FIG. 5B   ISO DIGIT
FIG. 5C   WORD LINE
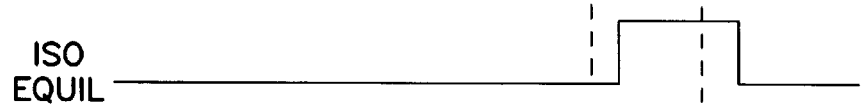
FIG. 5D   ISO EQUIL
FIG. 5E   PLat
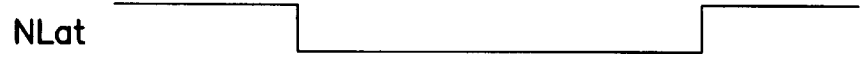
FIG. 5F   NLat
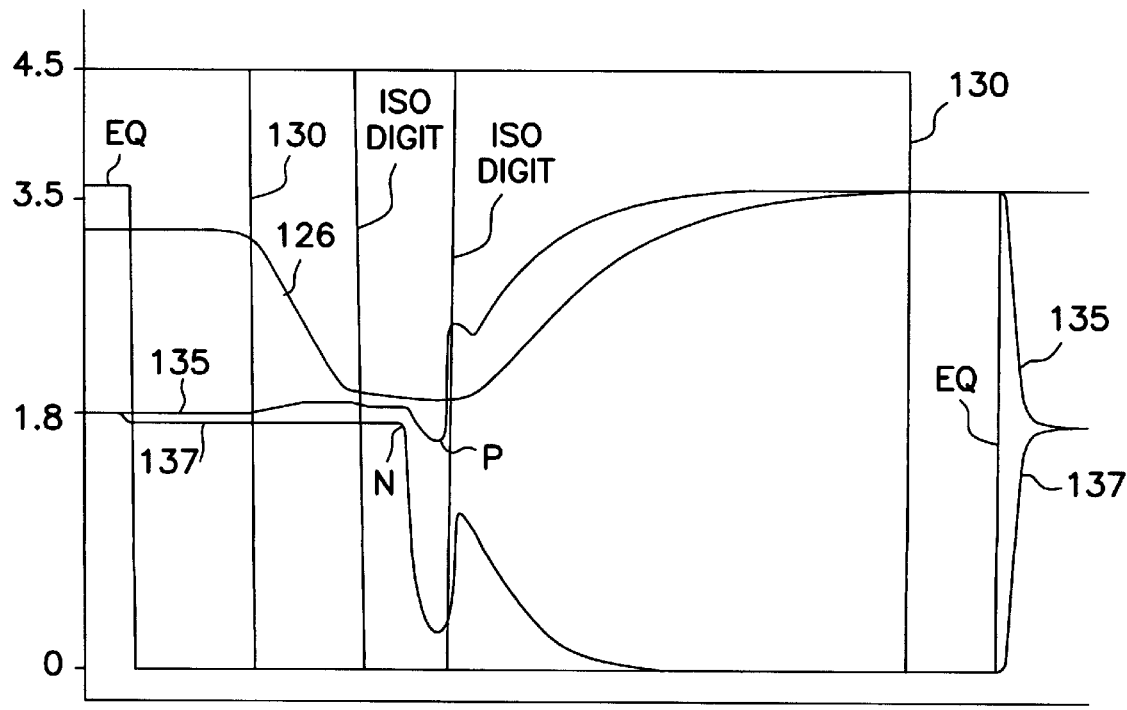
FIG. 6

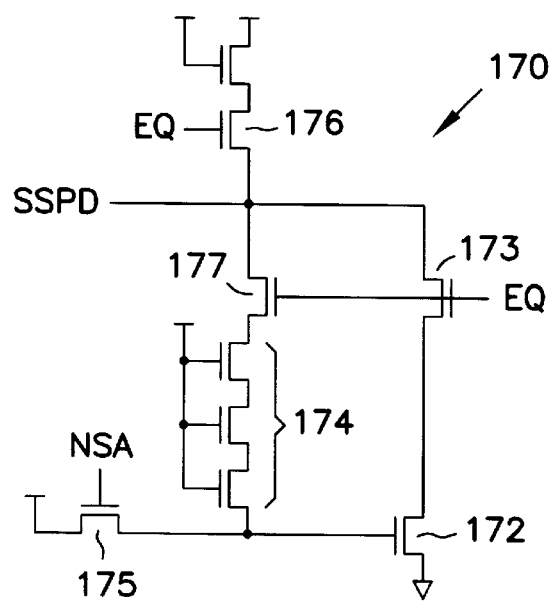
FIG. 8
FIG. 9A  ISO EQ
FIG. 9B  EQ
FIG. 9C  ISO DIGIT
FIG. 9D  WORDLINE
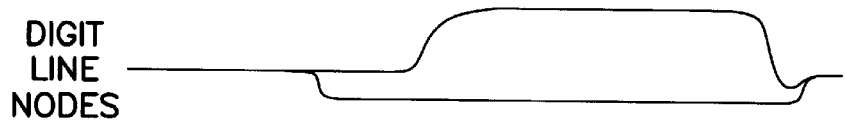
FIG. 9E  DIGIT LINE NODES

MEMORY DEVICE WITH SINGLE-ENDED SENSING AND LOW VOLTAGE PRE-CHARGE

TECHNICAL FIELD OF THE INVENTION

The present invention relates generally to dynamic memory integrated circuits and in particular the present invention relates to sensing circuits therein.

BACKGROUND OF THE INVENTION

Integrated circuit memories have become increasingly dense as the need for more memory storage increases. While fabrication techniques and design options have been fairly successful in maintaining steady increases in memory storage from design generation to generation, the need for new highly populated circuits continues.

A dynamic random access memory (DRAM) device is comprised of an arrangement of individual memory cells. Each memory cell comprises a capacitor capable of holding a charge and an access transistor for accessing the capacitor charge. The charge is referred to as a data bit and can be either a high voltage or a low voltage. Data can be either stored in the memory cells during a write mode, or data may be retrieved from the memory cells during a read mode. The data is transmitted on signal lines, referred to as bit or digit lines, which are coupled to input/output lines through transistors used as switching devices. For each bit of data stored, its true logic state is available on an I/O line and its complementary logic state is available at on an I/O compliment line. Thus, each memory cell has two digit lines, digit and digit complement.

Typically, the memory cells are arranged in an array and each cell has an address identifying its location in the array. The array comprises a configuration of intersecting rows and a memory cell is associated with each intersection. In order to read from or write to a cell, the particular cell in question must be selected, or addressed. The address for the selected cell is represented by input signals to a row decoder and to a column decoder. The row decoder activates a word line in response to the row address. The selected word line activates the access transistors for each of the memory cells in communication with the selected word line. The column decoder selects a digit line pair in response to the column address. For a read operation the selected word line activates the access transistors for a given row address, and data is latched to the digit line pairs.

Conventional dynamic memories use memory cells fabricated as capacitors in an integrated circuit to store data. That is, a logical "1" is stored as a charge on the capacitor and the capacitor is discharged for a logical"0". The pairs of digit lines are fabricated as metal lines on the integrated circuit and connected to the memory cells for transmitting data stored in the memory cells. Sense amplifiers are utilized to sense small differentials on the digit lines and drive the digit lines to full power supply rails for either reading the memory cells or writing thereto. Although unique fabrication techniques and processes have been developed to reduce the size of the memory cells and access circuitry, the physical spacing requirements for the digit line architecture creates a barrier to maximizing the available die area. That is, the reductions in memory cell size cannot be fully exploited due to the digit line pairs.

U.S. Pat. Nos. 5,625,588 and 5,684,749 describe a memory devices that includes a single ended sensing techniques. The equilibrate and pre-charge circuitry, however, may not be optimum for low voltage operation. For the reasons stated above, and for other reasons stated below which will become apparent to those skilled in the art upon reading and understanding the present specification, there is a need in the art for a sensing circuitry which reduces the need for die area while allowing low supply voltage operation.

SUMMARY OF THE INVENTION

The above mentioned problems with increasing the population of integrated circuit memories and other problems are addressed by the present invention and which will be understood by reading and studying the following specification. A dynamic memory circuit is described which uses sensing circuitry that reduces the number of metal digit lines needed to access the memory cells and reduces the need for boosted word line voltages.

In particular, one embodiment of the present invention provides an integrated circuit comprising a plurality of memory cell capacitors, and a plurality of access devices connected to the plurality of memory cell capacitors and a single digit line, each to selectively connect one of the plurality of memory cell capacitors to the single digit line. A differential sense amplifier circuit is provided that has first and second nodes each selectively connected to the single digit line through first and second isolation transistors. The first isolation transistor have a drain connected to the first node and a source connected to the digit single line. The second isolation transistor has a drain connected to the second node and a source connected to the single digit line. An equilibrate circuit is provided to equilibrate the first and second nodes to a pre-charge voltage level that is approximately a transistor threshold voltage above ground potential.

In another embodiment, a method of sensing data stored in a plurality of dynamic memory cell capacitors is provided. The method comprises equilibrating a sense amplifier circuit to a pre-charge voltage level that is approximately a transistor threshold voltage above ground potential. The sense amplifier circuit has a first node and a second node selectively connected to a single digit line through first and second isolation transistors. The first isolation transistor has a first terminal connected to the first node and a second terminal source connected to the single digit line. The second isolation transistor has a first terminal connected to the second node and a second terminal connected to the single digit line. The method includes providing an isolation signal to a gate of the second isolation transistor to electrically isolate the second node of the sense amplifier circuit from the single digit line, and sensing the data stored in a dynamic memory cell capacitor using a differential sense amplifier circuit.

BRIEF DESCRIPTION OF THE DRAWINGS

FIGS. 2A–2E illustrate a timing diagram of the sensing circuit of FIG. 1;

FIGS. 4A–4H illustrate a timing diagram of the circuit in FIG. 3;

FIGS. 5A–5F illustrate an alternate timing diagram of the circuit in FIG. 3;

FIG. 6 is a detailed diagram of a sensing and equilibration operation;

FIG. 8 is a schematic diagram of a pre-charge circuit;

FIGS. 9A–9E illustrate a timing diagram of the circuit of FIG. 7A;

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Prior to describing the present invention, a description of prior art double and single ended sensing memory devices are described. The present invention provides a low pre-charge voltage which allows for the use of non-boosted wordline and isolation control signals.

Figure 1:
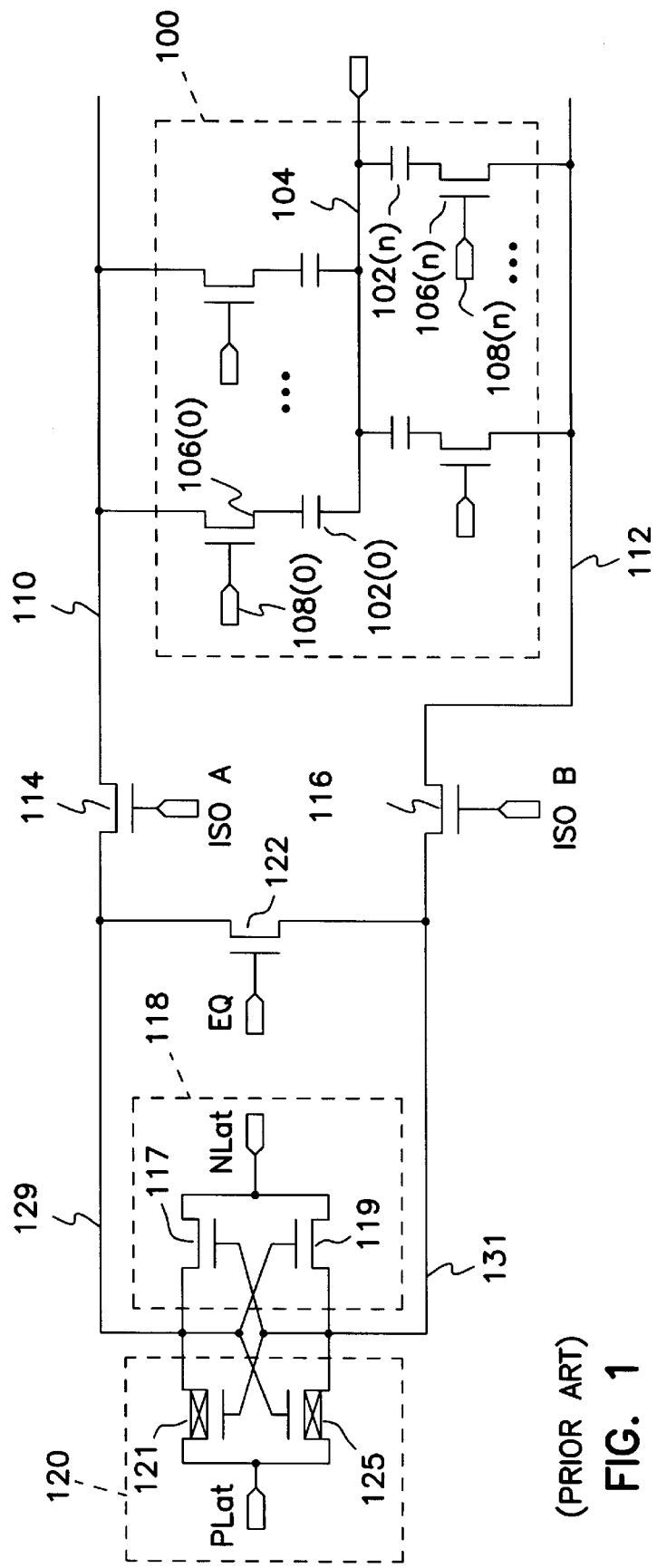
FIG. 1 is a schematic diagram of a related memory sensing circuit.

Referring to FIG. 1, a portion of a conventional dynamic memory access circuitry is described. a memory array 100 has a plurality of memory cells 102(0)–(n) which are fabricated as capacitors having one capacitive plate formed as a common cell plate 104 and the other node connected to an access transistor 106(0)–(n). Each access transistor is a n-type transistor having its gate connected to a word line 108(0)–(n). The cell plate 104 is typically biased to one-half the power supply voltage (Vcc) by a biasing source (not shown).

Digit lines 110 and 112 are each connected to some of the access transistors and memory cells. When access transistors 106 are selectively activated, the charge stored on the corresponding memory cell 102 is coupled to one of the digit lines. N-type isolation transistors 114 and 116 are used to isolate digit lines 110 and 112, respectively, from both the n-sense amp 118 and the p-sense amp 120. Equilibrate transistor 122 is used to equalize the nodes of the sense amps to the same voltage, as described below.

In operation, data stored in the memory cells can be accessed and sensed following the process shown in FIGS. 2A–2E. The first step is to equilibrate nodes 129 and 131 of sense amps 118 and 120 to Vcc/2, as sourced by a biasing circuit (not shown), by holding the gate of transistor 122 (EQ) high. The differential voltage across the sense amps is therefore zero with each node having a preferred voltage of one-half the supply voltage (Vcc). The next step is to activate isolation transistors 114 and 116 by providing their gates (ISO a and ISO B, respectively) with a high voltage. This connects the digit lines 110 and 112 to the sense amps 118 and 120 and allows the digit lines to also stabilize to Vcc/2. One of the memory cell access transistors 106(0)–(n) is then selectively activated by raising the associated word line 108(0)–(n) gate voltage. The charge, or lack of charge, stored on the selected memory cell 102 is then shared with one of the digit lines. If a logical "one" is stored on the capacitor the associated digit line will be slightly raised, for example by a voltage of approximately 100 mv. It will be understood that the charge shared with the digit line is directly dependant upon the charge stored on the memory cell. If the memory cell is un-charged the digit line voltage will drop, for example by 100 mv.

The n-sense amp 118 and the p-sense amp 120, as known to one skilled in the art, sense a differential between the digit lines and drive the digit lines to full rails in response. N-sense amp 118 has two n-channel transistors having their gates cross-coupled to the source of the other transistor. The drains of each transistor are connected together and controlled by an NLat line. The NLat line is typically pre-charged to the same level that nodes 129 and 131 have been equalized to, Vcc/2. The voltage on the NLat line is lowered to sense a high voltage on one of the nodes. Assuming for example that node 129 is 100 mv above node 131, transistor 119 will begin to turn on when the NLat drops by a threshold voltage below node 129. Node 131 will then be pulled to NLat to insure that transistor 117 does not turn on. Similarly, p-sense amp 120 has two cross-coupled p-channel transistors 121 and 125. The drains of each transistor are connected together and controlled by a PLat line. The PLat line is typically pre-charged to the same level that nodes 129 and 131 have been equalized to, Vcc/2. The voltage on the PLat line is raised to sense a low voltage on one of the nodes. Assuming for example that node 131 is 100 mv below node 129, transistor 121 will begin to turn on when the PLat increases by a threshold voltage above node 131. Node 129 will then be pulled to PLat to insure that transistor 125 does not turn on. The NLat and PLat are strobed to full power rails, ground and Vcc, respectively. If one of the digit lines is higher, therefore, that digit line will be driven to Vcc while the complementary digit line is pulled to ground.

As seen in FIGS. 2A–2E, the voltage on the digit lines are equal until shortly after the word line is activated. The n-sense amp is strobed first to drive one line low and then the p-sense amp is strobed to drive the other line high. The digit lines remain latched at these full power levels until the equilibrate transistor 122 is again activated. During the time in which the word line is high and the digit lines are latched, the memory cell is refreshed.

Figure 3:
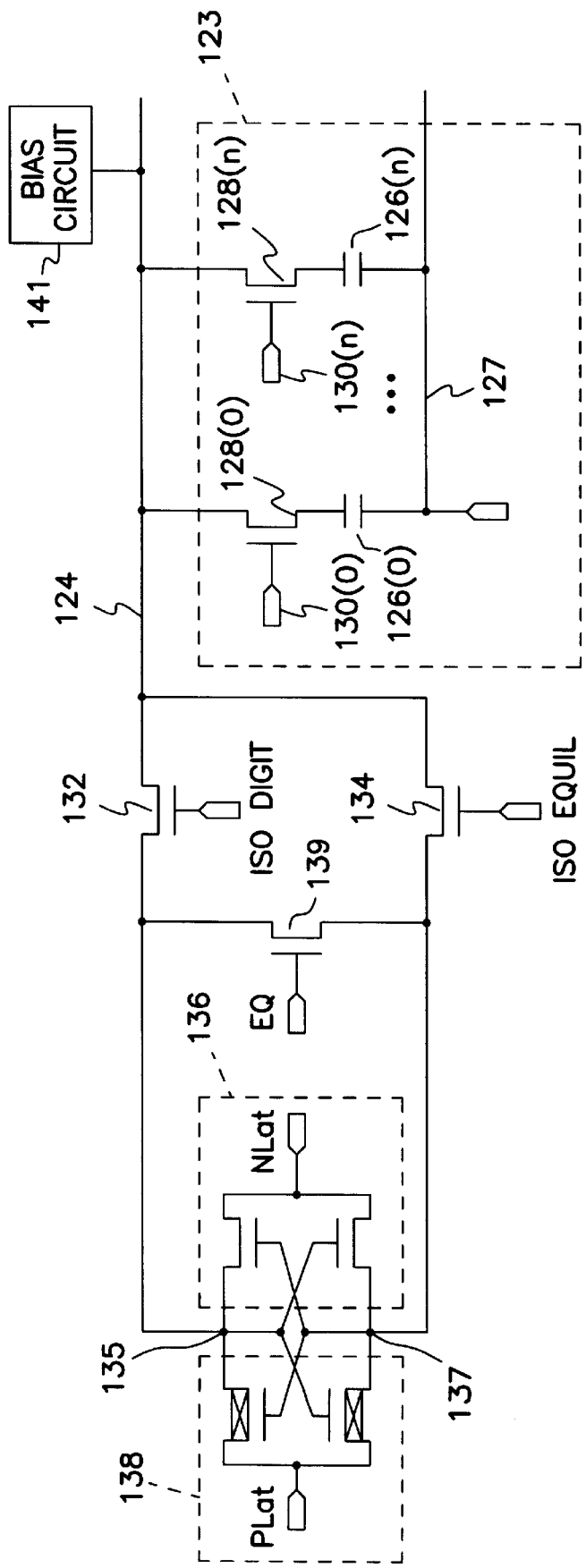
FIG. 3 is a schematic of a sensing circuit.

As stated above, the digit lines are fabricated as metal lines which require a relatively large commitment of die area and create a barrier to increasing the density of a memory device. It would be beneficial, therefore, to reduce the number of digit lines. FIG. 3 illustrates a sensing circuit of a single ended sensing memory device, see U.S. Pat. Nos. 5,625,588 and 5,684,749. a memory array 123 is comprised of memory cells 126(0)–(n) fabricated as capacitors with one node connected to a common cell plate 127. The cell plate is biased to one-half Vcc by a biasing circuit (not shown). The other plate of each memory cell 126 is connected to one of the n-type access transistors 128(0)–(n). The access transistors are connected to digit line 124 and have their gate connected one of the word lines 130(0)–(n). Isolation transistor 132 is provided to selectively isolate digit line 124 from node 135 of both the n-sense amp 136 and the p-sense amp 138. Likewise, n-type isolation/equilibrate transistor 134 is connected between node 137 of the sense amps and the digit line 124. N-type equilibrate transistor 139 is provided to equalize nodes 135 and 137 of the sense amps to a common voltage. As described below, this common voltage is preferably near Vcc/2.

Referring to FIGS. 4A–4H, to sense data stored on a memory cell 126 the digit line 124 and nodes 135 and 137 of the sense amps are equalized by activating the gate of transistor 139 (EQ). Transistor 134 is then turned off by lowering its gate voltage (ISO Equil). Prior to sensing stored data, the equilibrate transistor 139 is turned off. The voltage at node 137 is coupled down when transistor 139 is turned off. For example, the voltage on node 137 drops by approximately 20 mv when transistor 139 is turned off. Node 135, however, remains relatively unchanged because the large capacitance on digit line 124 resists the coupling effect of transistor 139 and maintains a relatively stable voltage. It will be understood, therefore, that a small differential voltage is immediately imparted between the sense amp nodes 135 and 137 when transistor 139 is turned off. Because the typical differential resulting from data stored on a memory cell is approximately 100 mv, a differential of 20 mv resulting from coupling is significant and must be addressed, as explained below.

Node 137 is latched to the equilibrate voltage, less the coupling effect. One of the access transistors 128(0)–(n) is selectively activated by raising the corresponding word line 130(0)–(n). The charge, or lack of charge, stored in the memory cell is shared with the digit line and sense amp node 135. The change in the voltage on the digit line is dependent upon the charge stored in the memory cell, typically this voltage differential, as stated above, is approximately ±100 mv.

After the charge has been coupled to the digit line, isolation transistor 132 is turned off by lowering its gate voltage (ISO Digit) to isolate node 135 from the selected digit line. By isolating node 135 from the digit line 124, the capacitance of digit line 124 is eliminated and node 135 will be coupled down by the same amount that node 137 was coupled down. The total differential between sense amp nodes 135 and 137 is equal, therefore, to the charge stored upon the selected memory cell.

The sense amps are then strobed using NLat and PLat to drive node 135 to the appropriate supply level, as known to one skilled in the art. That is, if node 135 is above the equilibrate level, the node is driven to Vcc and if node 135 is below the equilibrate level it is driven to ground. Isolation transistor 132 is then re-activated by raising ISO Digit so that the entire digit line 124 can go to the appropriate power rail and the memory cell can be refreshed. After word line 130 returns to a low level, the equilibrate transistor can be re-activated to insure that both nodes of the sense amps and the digit line are equalized.

Connecting nodes 135 and 137 through transistor 139 while the sense amps are activated will result in a crossing current in the sense amps. This crossing current can be relatively large and economically undesirable. It will be understood that when one sense amp node is originally at Vcc and the other is at ground, the resulting equilibrate level will be near Vcc/2.

Alternatively, transistor 134 can be used to selectively connect node 137 to the digit line 124 to equilibrate the sense amps by forcing node 137 to an opposite state. That is, by first isolating node 135 from the digit line 124 and then activating transistor 134, the sense amps will force the voltage on the digit line to change its state. If, for example, the digit line is a "one" when transistor 134 is activated, the voltage on the digit line will be forced to transition low by the n-sense amp. It will be understood that by holding node 135 constant and using transistor 134, crossing currents are avoided. a trigger or tracking circuit (not shown) can be used to latch the voltage at a level near Vcc/2. One embodiment would be to use a timing circuit to turn on equilibrate transistor 139 and turn off sense amps 136 and 138.

FIGS. 5A–5F illustrate the timing of this alternate equilibrate circuit. Equilibrate transistor 139 is turned off by lowering its gate voltage (EQ). Transistor 134 is turned off by lowering its gate, ISO Equil. a word line 130 is raised to access a memory cell 126 and transistor 132 is de-activated by lowering its gate voltage (ISO Digit). The sense amps are strobed using NLat and PLat, and transistor 132 is re-activated to refresh the memory cell. After the word line has returned low, transistor 132 is turned off to isolate digit line 124 from node 135. Transistor 134 is activated by raising its gate voltage (ISO Equil) and node 137 is connected to the digit line. The sense amps will force the digit line to begin to change states by either charging or discharging the digit line. When the voltage on the digit line is approximately Vcc/2 a timing or trigger circuit will activate equilibrate transistor 139 and turn off the sense amps. Both nodes 135 and 137 are therefore equalized and transistors 132 is activated. Finally, transistor 134 is turned off.

An optional bias circuit 141 is shown in FIG. 3. This circuit can be used to bias the digit line 142 to a predetermined voltage level. By activating transistors 132 and 139 the nodes of the sense amps could be equilibrated to the predetermined voltage level. This equilibrate option requires additional die area and is therefore economically less desirable then the other equilibrate circuits.

FIG. 6 is a more detailed diagram of a sensing operation on a selected memory cell which contains data stored as a "one" in the circuit of FIG. 3. It can be seen that prior to the gate of transistor 139 (EQ) falling from Vcc (3.6 volts) the sense amp nodes 135 and 137 are equalized at 1.8 volts (Vcc/2). Node 137 is coupled low when EQ goes low, thereby, creating a small differential between nodes 135 and 137. One of the memory cells 126 is selected by raising its associated word line 130. The charge stored on the memory cell is shared with the digit line and node 135. The capacitance of the digit line 124 is higher than the capacitance of the memory cell, thus the voltage of node 135 only increases by a fraction of the drop in voltage on the memory cell. Transistor 132 is turned off by lowering the ISO Digit line. As a result, node 135 is coupled low and the differential voltage between the sense amp nodes reflects a true value of the memory cell charge. After the sense amps are electrically isolated from the digit line, the n-sense amp 136 is strobed (shown as point N) and then the p-sense amp 138 is strobed (shown as point P). Note that node 135 is coupled low after the n-sense amp is strobed, but is pulled high when the p-sense amp is strobed. Transistor 132 is re-activated to connect node 135 to the digit line and memory cell 126. Both nodes of the sense amps are coupled high when the ISO Digit line goes high. Node 135 is pulled high by the p-sense amp and node 137 is pulled low by the n-sense amp. The memory cell is refreshed during the time that both transistor 132 and transistor 130 are activated. That is, the voltage on memory cell 126 is pulled to Vcc to re-charge the cell. It will be recognized that the gate voltages on transistors 132 and 130 are connected to a pump voltage which has a high level above Vcc, as known to one skilled in the art. The EQ line returns high to activate transistor 139 and nodes 135 and 137 are equilibrated to Vcc/2.

Near Ground Pre-Charging

The above described memory devices are not optimum for low supply voltage operations. That is, supply voltages for memory devices have been experiencing consistent reductions between memory device generations. This reduction in supply voltages creates problems with operating speeds of the above memory devices. For example, sense amplifier speed can be reduced as the supply voltage reduces because of the small differential voltages between the sense amplifier nodes. Further, elevated word line and isolation device control signals are required at low voltages, such as 1.8 volt supply levels.

By equilibrating the digit line(s) to ½ Vcc prior to accessing a memory cell, two problems are encountered when the above memory devices operate at a reduced supply voltage. The first problem is the need for a boosted voltage on both word lines and isolation control lines. This is due to the voltage difference between the pre-charged digit line voltage and the supply voltage. For example, the digit line pre-charge voltage (½ Vcc) of a memory device having a 1.8 volt supply (Vcc) is 0.9 volts. a typical n-channel transistor threshold voltage is a substantial portion of the 0.9 volt differential between the pre-charge voltage and Vcc. Thus, if a boosted word line voltage were not used, the charge shared from a memory cell storing a one would not be sufficient to create a voltage change on the associated digit line. a boosted word line. Therefore, is required to couple a full memory cell charge to its associated digit line when low supply voltages are used.

A second problem with low voltage DRAMs is the speed of the sense amplifier circuitry. As explained above, the sense amplifier circuitry comprises a p-sense circuit and an n-sense circuit. After a memory cell is accessed, the n-sense amplifier is traditionally activated first to pull the low digit line of the digit line pair to ground. In a low voltage memory device, the n-sense amplifier is slow to operate. For example, in a 1.8 volt supplied memory one digit line will be about 0.9 volts and the complimentary digit line will be about 1.1 volts. As such, one of the transistors will have a gate voltage of 1.1 volts and a source to drain voltage of 0.9 volts. This transistor will be relatively slow to activate. As such, low supply voltage memory devices can have difficulties performing fast memory read operations.

Figure 7A:
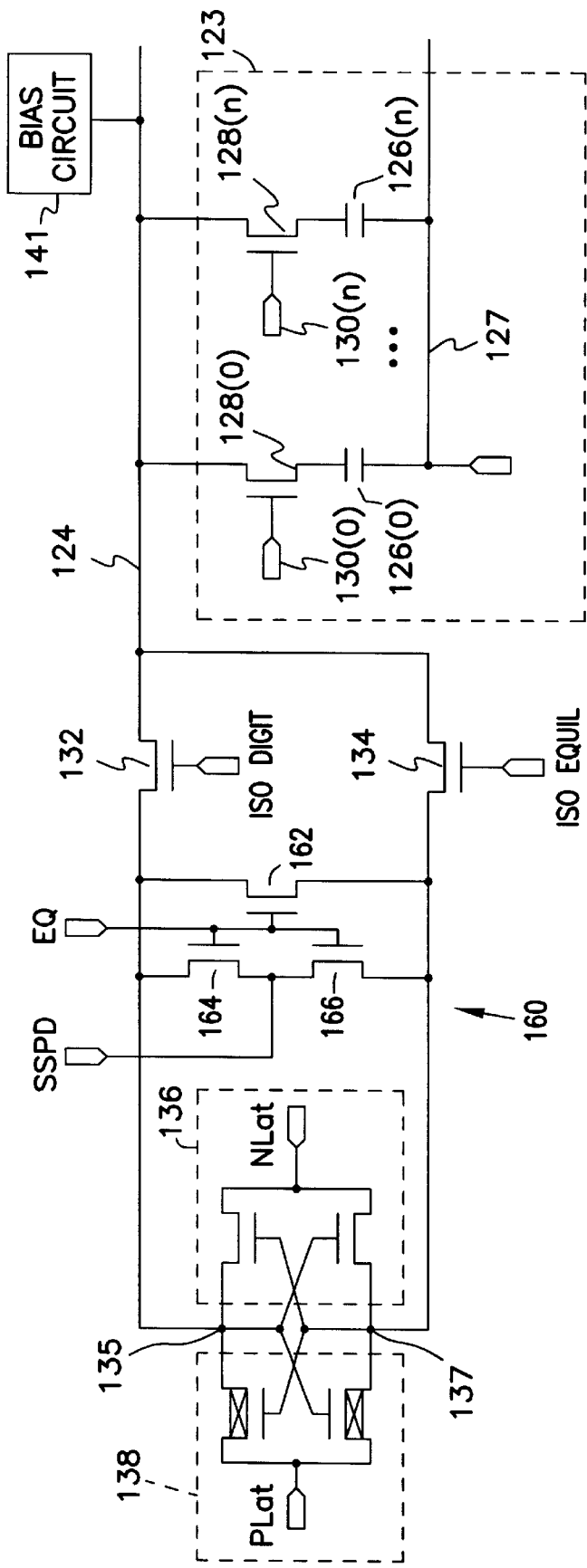
FIG. 7A, is a schematic diagram of a memory sensing circuit of one embodiment of the present invention.

The present invention, as illustrated in FIG. 7A, includes an equilibrate circuit 160 that pre-charges the sense amplifier nodes and digit line to a low voltage (SSPD), such as ground plus a threshold voltage. In one embodiment, SSPD can be in the range of 0.3 to 0.8 V. In another embodiment, SSPD can be in any of the following ranges 0.2 to 0.3, 0.3 to 0.4, 0.4 to 0.5, 0.5 to 0.6, 0.6 to 0.7 and/or 0.7 to 0.8 V. In a low supply voltage device, for example 1.8 volt Vcc, the pre-charge/equilibrate voltage is substantially less than ½ Vcc.

The embodiment in FIG. 7A includes sense amplifier circuitry 136 and 138, an array of memory cells 123, isolation circuitry 132 and 134, and equilibrate circuitry 160 coupled to the sense amplifier circuitry. Equilibrate circuit 160 includes two n-channel transistors 164 and 166 coupled between sense amplifier nodes 135 and 137 and a sense amplifier pre-charge node (SSPD). a third transistor 162 can also be provided. One embodiment of a pre-charge circuit 170 that can be used to provide SSPD is illustrated in FIG. 8.

Figure 7B:
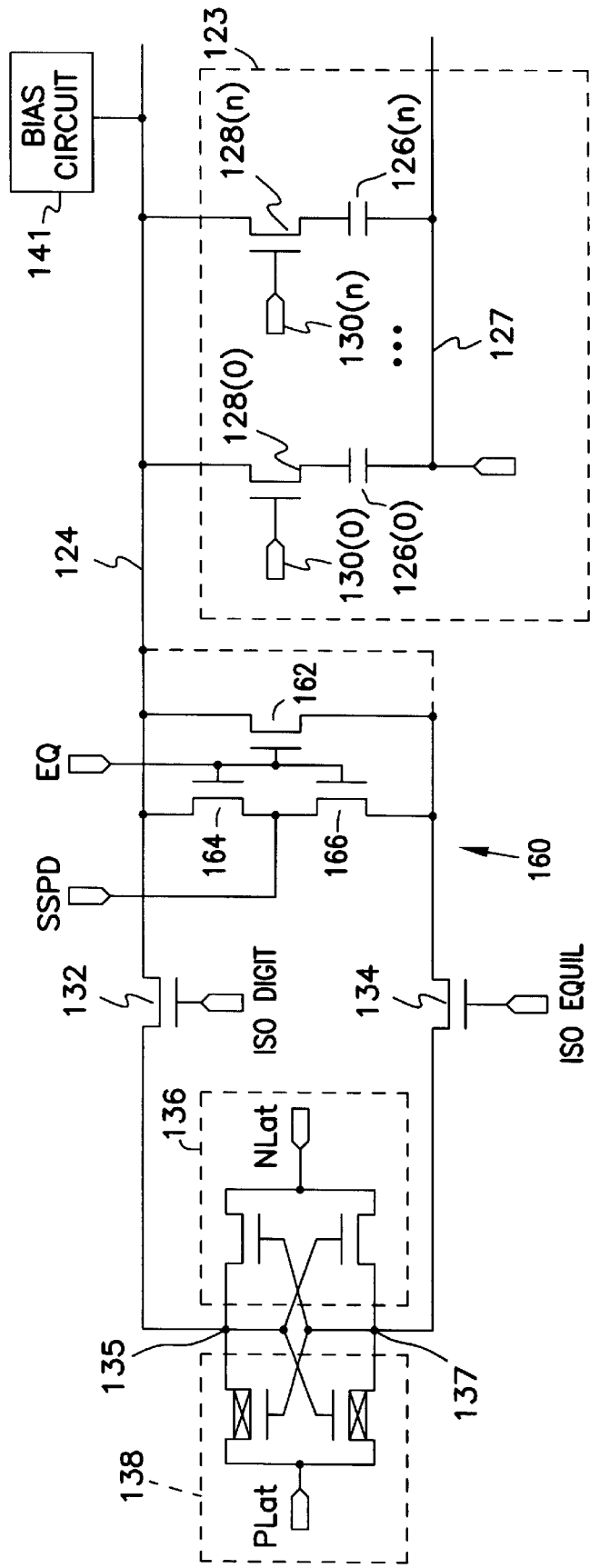
FIG. 7B is a schematic diagram of a memory sensing circuit of another embodiment of the present invention.

An alternate embodiment of the present invention is illustrated in FIG. 7B. In this embodiment, equilibrate circuitry 160 is separated from sense amplifier nodes 135 and 137 by isolation transistors 132 and 134. This embodiment can be used to reduce a coupling effect experienced by the sense amplifier nodes. In addition to the location of the equilibrate circuit, the direct connection between isolation transistors 132 and 134 can be eliminated. That is, the equilibrate circuit can be used to couple the sense nodes together.

Referring to FIG. 8, the pre-charge circuit includes a pull-down transistor 172 that is activated when transistor 175 is activated in response to the n-sense amplifier deactivation (NSA signal is high when the n-sense amplifier is off). That is, when the n-sense amplifier is deactivated, the gate of transistor 175 is coupled to the upper voltage supply, Vcc. When the EQ signal is in a high state (equilibrate operation is active), transistors 173 and 176 are all activated. This allows the pull-down transistor to pull node SSPD low through transistor 173. Pulling SSPD low, however, pulls the gate of the pull-down transistor high through transistors 174 and 177. As such, a feedback is created that keeps the pull down transistor partially activated such that SSPD does not stay pulled to ground, but maintains a low voltage level during equilibration. Other pre-charge circuits can be used to provide a pre-charge voltage that is close to ground potential, without departing from the present invention.

FIGS. 9A–9E illustrate a timing diagram of a representative read operation of the circuit of FIG. 7A. Following a prior access operation, the sense amplifier nodes are coupled to the digit line as indicated by high ISO EQ and ISO DIGIT signals. The EQ signal is in a high state to activate equilibrate transistors and the pre-charge circuitry. The sense amplifier nodes and the digit line are then equilibrated to a low voltage level, for example one transistor threshold voltage above ground. The ISO EQ signal goes low to isolate the digit line from the second node of the sense amplifier. As such, the digit line is still coupled to the first sense amplifier node. a wordline is activated (high state) to couple a memory cell to the digit line. The memory cell changes a voltage on the pre-charged digit line and sense amplifier node. Thus, the digit line is pulled lower if the memory cell is storing a zero, and the digit line voltage increases if the memory cell contains a one. After the digit line and sense amplifier node voltages change, the ISO DIGIT signal goes low to isolate the digit line from the first sense amplifier node. After the sense amplifier circuit is electrically isolated from the array, the p-sense amplifier circuitry is activated to sense the difference between the sense amplifier nodes. The p-sense amplifier circuitry pulls the higher of the sense nodes to an upper voltage supply level. The n-sense amplifier circuitry is then activated to pull the low sense amplifier node to ground, or the low supply voltage. After the data has been sensed, the ISO EQ signal goes high to couple the sense amplifier to the digit line to re-write the data to the memory cell (the wordline is still active). After the memory cell access transistor is turned off (low wordline voltage), the ISO DIGIT signal is activated in preparation of the equilibration operation. The operation of the embodiment of FIG. 7B is substantially the same. During the equilibration operation, both isolation devices are activated.

Ground Pre-charging

Figure 10:
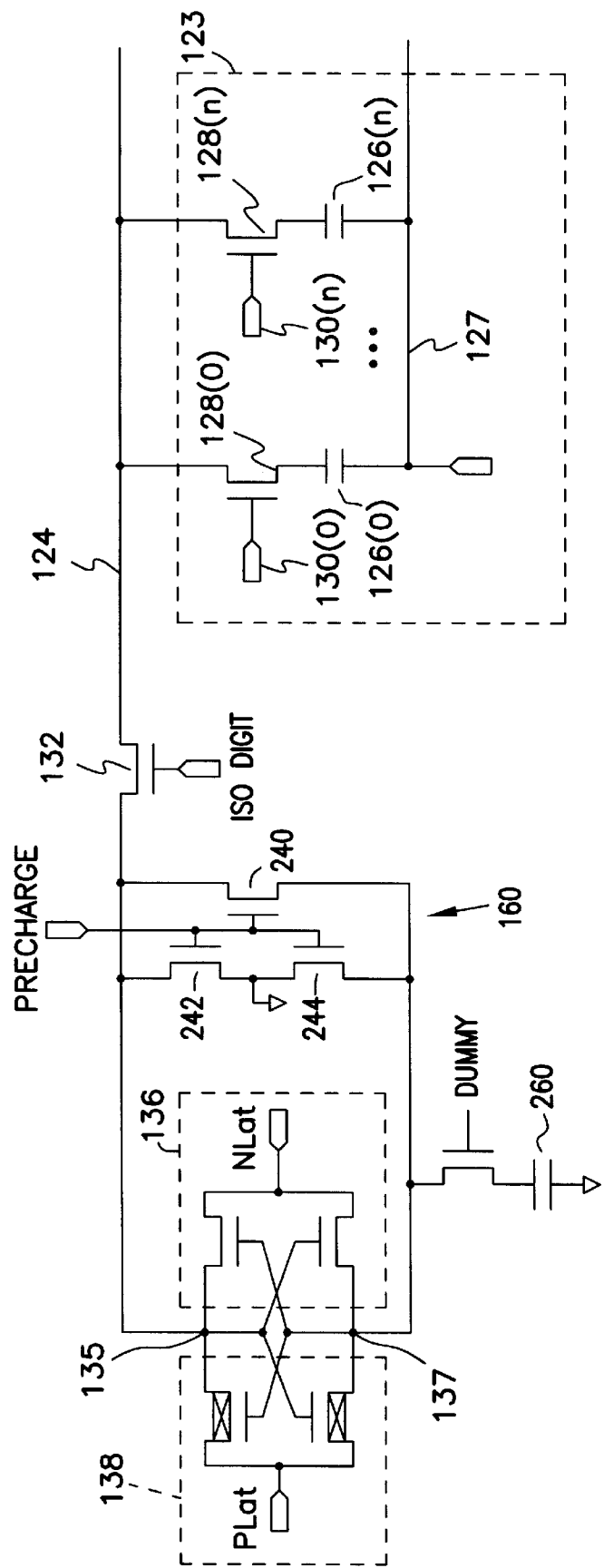
FIG. 10 is a schematic diagram of a memory sensing circuit of another embodiment of the present invention.

The above described embodiment uses a pre-charge voltage level that is near ground level. An alternate embodiment uses a ground level pre-charge. This embodiment is illustrated in FIG. 10. The circuit operation is similar to that described above, however, the sense amplifier nodes 135 and 137, and the digit line 124 are pre-charged to ground. That is, the isolation transistor 132 is activated during the pre-charge. Likewise, equilibrate transistors 240, 242 and 244 are activated during pre-charge.

During data read operations, isolation transistor 132 is initially activated and transistor 134 is turned off. A word line 130(0) is activated to couple a memory cell to the digit line 124. If the memory cell is storing a charge (logic one) the digit line will increase in voltage. For example, assuming a 150 fF digit line and a 25 fF memory cell, the digit line will increase to about 257 mV when the memory cell has a voltage of 1.8 V. If the memory cell does not have a stored a charge (logic zero) the digit line will remain at ground.

After a memory cell has been accessed and a charge shared with the digit line and sense amplifier node, the digit line isolation transistor 132 is turned off. One or more dummy memory cells 260 are then coupled to the other sense amplifier node 137. The dummy cell stores a charge sufficient to raise the sense amplifier node to a voltage level between ground and the charged level of the digit line. For example, in one embodiment the dummy cell raises the sense amplifier voltage in the range of 100 to 125 mV. By using a ground pre-charge, the memory can use a lower word line voltage (Vt above ground), simplifies layout and eliminates a need for complimentary digit lines.

Figure 11:
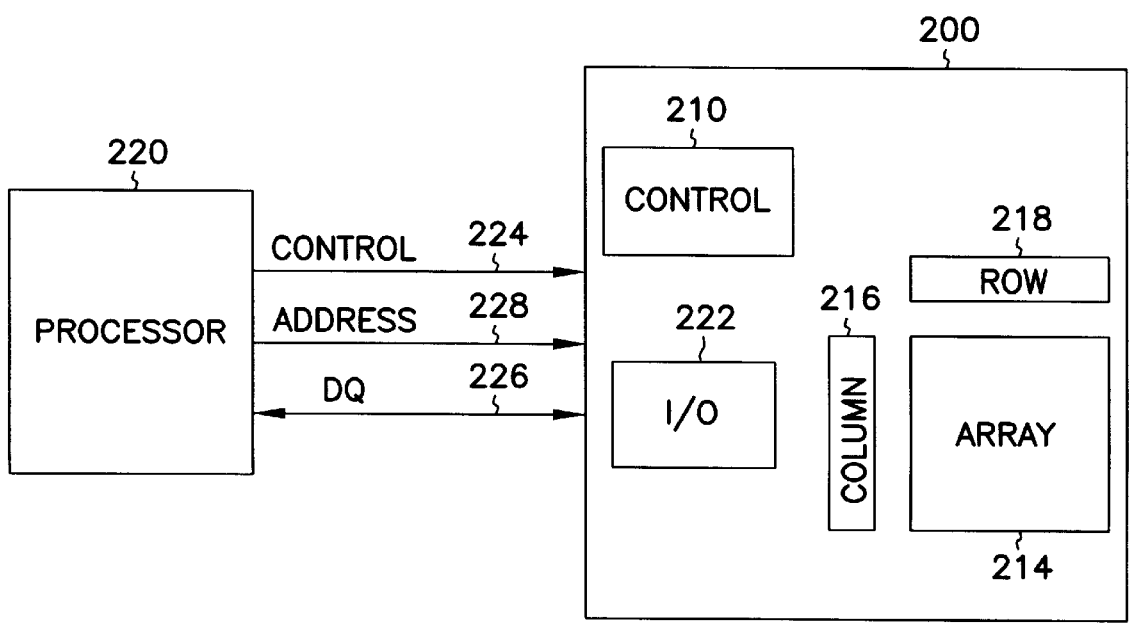
FIG. 11 is a block diagram of a memory system of the present invention.

FIG. 11 illustrates an integrated circuit memory device including the equilibrate and pre-charge circuitry. The device can be a memory circuit 200 such as a dynamic random access memory (DRAM) which is coupled to a processor 220. The memory device can be coupled to a processor 220 such as a microprocessor of a personal computer. The memory device 200 includes a memory array 214 having rows and columns of memory cells. Column decoder 216 and row decoder 218 are provided to access the memory array in response to address signals provided by the processor 220 on address communication lines 228. Data communication is conducted via I/O buffer circuitry 222 and bi-directional data communication lines 226 (DQ). Internal control circuitry 210 accesses the memory array in response to commands provided by the processor 220 on control lines 224. The array includes pre-charge and equilibrate circuitry described in detail above. It will be appreciated by those skilled in the art that the present invention is equally applicable to other types of dynamic memory devices.

Conclusion

An integrated circuit dynamic memory which requires less digit lines has been described. The integrated circuit uses one digit line in place of two digit lines for sensing charges stored on memory cell capacitors. The memory device uses a low digit line pre-charge to provide a low supply voltage memory. In particular, the description provides a memory device which uses sense amplifier nodes to provide a pre-charge supply to the digit line. By using the low pre-charge voltage, the memory device does not require boosted word line and isolation control voltages. Further, the p-sense amplifier circuitry is activated prior to n-sense amplifier circuitry to increase the sensing speed of the low voltage memory device.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention.

What is claimed is:

1. An integrated circuit comprising:
    a plurality of memory cell capacitors;
    a plurality of access devices connected to the plurality of memory cell capacitors and a single digit line, each to selectively connect one of the plurality of memory cell capacitors to the single digit line;
    a differential sense amplifier circuit having first and second nodes each selectively connected to the single digit line through first and second isolation transistors, the first isolation transistor having a drain connected to the first node and a source connected to the digit single line, the second isolation transistor having a drain connected to the second node and a source connected to the single digit line; and
    an equilibrate circuit to equilibrate the first and second nodes to a pre-charge voltage level that is approximately a transistor threshold voltage above ground potential.

2. The integrated circuit of claim 1 wherein the differential sense amplifier comprises:
    a first n-channel transistor having a gate connected to the second node and a source connected to the first node;
    a second n-channel transistor having a gate connected to the first node, a drain connected to a drain of the first n-channel transistor, and a source connected to the second node;
    a first p-channel transistor having a gate connected to the second node and a source connected to the first node; and
    a second p-channel transistor having a gate connected to the first node, a drain connected to a drain of the first p-channel transistor, and a source connected to the second node.

3. The integrated circuit of claim 1 further comprising:
    a first isolation signal coupled to a gate of the first isolation transistor to selectively connect the first node to the single digit line.

4. The integrated circuit of claim 1 further comprising:
    a second isolation signal coupled to a gate of the second isolation transistor to selectively connect the second node to the single digit line.

5. The integrated circuit of claim 1 wherein the equilibrate circuit comprises:
    a pre-charge circuit providing the pre-charge voltage;
    a first n-channel transistor coupled between the pre-charge circuit and the first node; and
    a second n-channel transistor coupled between the pre-charge circuit and the second node.

6. The integrated circuit of claim 1 wherein pre-charge voltage is in the range of 0.2 to 0.8 V.

7. A dynamic memory comprising:
    a plurality of memory cell capacitors;
    a plurality of access devices connected to the plurality of memory cell capacitors and a single digit line, each to selectively connect one of the plurality of memory cell capacitors to the single digit line;
    a differential sense amplifier having first and second nodes;
    an equilibrate circuit coupled to the differential sense amplifier to equilibrate the first and second nodes to a pre-charge voltage level that is approximately a transistor threshold voltage above ground potential;
    a first isolation transistor electrically located between the first node of the differential sense amplifier and the single digit line to selectively isolate the first node from the single digit line in response to a gate voltage; and
    a second isolation transistor electrically located between the second node of the differential sense amplifier and the single digit line to selectively isolate the second node from the single digit line in response to a gate voltage.

8. The dynamic memory of claim 7 wherein the differential sense amplifier comprises:

a first n-channel transistor having a gate connected to the second node and a source connected to the first node;

a second n-channel transistor having a gate connected to the first node, a drain connected to a drain of the first n-channel transistor, and a source connected to the second node;

a first p-channel transistor having a gate connected to the second node and a source connected to the first node; and a second p-channel transistor having a gate connected to the first node, a drain connected to a drain of the first p-channel transistor, and a source connected to the second node.

9. The dynamic memory of claim 7 wherein the equilibrate circuit comprises:

a pre-charge circuit providing the pre-charge voltage;

a first n-channel transistor coupled between the pre-charge circuit and the first node; and a second n-channel transistor coupled between the pre-charge circuit and the second node.

10. The dynamic memory of claim 7 wherein pre-charge voltage is in the range of 0.2 to 0.8 volts.

11. A method of sensing data stored in a plurality of dynamic memory cell capacitors, the method comprising:

equilibrating a sense amplifier circuit to a pre-charge voltage level that is approximately a transistor threshold voltage above ground potential, the sense amplifier circuit having a first node and a second node selectively connected to a single digit line through first and second isolation transistors, the first isolation transistor having a first terminal connected to the first node and a second terminal source connected to the single digit line, the second isolation transistor having a first terminal connected to the second node and a second terminal connected to the single digit line;

providing an isolation signal to a gate of the second isolation transistor to electrically isolate the second node of the sense amplifier circuit from the single digit line; and sensing the data stored in a dynamic memory cell capacitor using the sense amplifier circuit.

12. The method of claim 11 wherein sensing the data stored in the dynamic memory cell capacitor further comprises:

selectively connecting a dynamic memory cell capacitor to the single digit line;

providing an isolation signal to a gate of the first isolation transistor to electrically isolate the first node of the sense amplifier circuit from the single digit line; and using the sense amplifier circuit, sensing a differential voltage between the first node and the second node.

13. The method of claim 12 wherein the sense amplifier circuit comprises a p-sense circuit and an n-sense circuit and the differential voltage between the first node and the second node is sensed by activating the p-sense circuit prior to activating the n-sense circuit.

14. The method of claim 11 wherein the pre-charge voltage is in the range of 0.2 to 0.8 volts.

15. A method of sensing data stored in a plurality of dynamic memory cell capacitors, the method comprising in the order of:

equilibrating a sense amplifier circuit to a pre-charge voltage level that is in the range of 0.2 to 0.8 volts, the sense amplifier circuit having a first node and a second node;

electrically isolating a single digit line from the second node;

coupling a selected memory cell to the single digit line while the single digit line is coupled to the first node;

electrically isolating the single digit line from the first node;

activating a p-sense circuit of the sense amplifier coupled to the first and second node; and activating an n-sense circuit of the sense amplifier coupled to the first and second node.

16. The method of claim 15 further comprises electrically coupling the single digit line to the first node after activating the n-sense circuit to re-write data to the selected memory cell.

17. The method of claim 15 further comprises in the order of:

electrically coupling the single digit line to the first node after activating the n-sense circuit to re-write data to the selected memory cell;

electrically isolating the selected memory cell from the single digit line; and electrically coupling the first and second nodes to the single digit line.

18. An integrated circuit memory system comprising:

a processor; and a memory device coupled to the processor, the memory device comprising, a plurality of memory cell capacitors;

a plurality of access devices connected to the plurality of memory cell capacitors and a single digit line, each to selectively connect one of the plurality of memory cell capacitors to the single digit line;

a differential sense amplifier having first and second nodes;

an equilibrate circuit coupled to the differential sense amplifier to equilibrate the first and second nodes to a pre-charge voltage level that is approximately a transistor threshold voltage above ground potential, the equilibrate circuit comprises a pre-charge circuit providing the pre-charge voltage, a first n-channel transistor coupled between the pre-charge circuit and the first node, and a second n-channel transistor coupled between the pre-charge circuit and the second node;

a first isolation transistor electrically located between the first node of the differential sense amplifier and the single digit line to selectively isolate the first node from the single digit line in response to a gate voltage; and a second isolation transistor electrically located between the second node of the differential sense amplifier and the single digit line to selectively isolate the second node from the single digit line in response to a gate voltage.

19. An integrated circuit comprising:

a plurality of memory cell capacitors;

a plurality of access devices connected to the plurality of memory cell capacitors and a single digit line, each to selectively connect one of the plurality of memory cell capacitors to the single digit line;

a differential sense amplifier circuit having first and second nodes, the first node is selectively connected to the single digit line through a first isolation transistors, the first isolation transistor having a drain connected to the first node and a source connected to the digit single line; and an equilibrate circuit to equilibrate the first and second nodes to a pre-charge voltage level that is ground potential.

20. The integrated circuit of claim 19 wherein the differential sense amplifier comprises:
a first n-channel transistor having a gate connected to the second node and a source connected to the first node;
a second n-channel transistor having a gate connected to the first node, a drain connected to a drain of the first n-channel transistor, and a source connected to the second node;
a first p-channel transistor having a gate connected to the second node and a source connected to the first node; and
a second p-channel transistor having a gate connected to the first node, a drain connected to a drain of the first p-channel transistor, and a source connected to the second node.

21. The integrated circuit of claim 19 further comprising:
a first isolation signal coupled to a gate of the first isolation transistor to selectively connect the first node to the single digit line.

22. The integrated circuit of claim 19 wherein the equilibrate circuit comprises:
a pre-charge node providing the pre-charge voltage;
a first n-channel transistor coupled between the pre-charge node and the; first node; and
a second n-channel transistor coupled between the pre-charge node and the second node.

23. A dynamic memory comprising:
a plurality of memory cell capacitors;
a plurality of access devices connected to the plurality of memory cell capacitors and a single digit line, each to selectively connect one of the plurality of memory cell capacitors to the single digit line;
a differential sense amplifier having first and second nodes;
an equilibrate circuit coupled to the differential sense amplifier to equilibrate the first and second nodes to a pre-charge voltage level that is a ground potential; and
a first isolation transistor electrically located between the first node of the differential sense amplifier and the single digit line to selectively isolate the first node from the single digit line in response to a gate voltage.

24. The dynamic memory of claim 23 wherein the differential sense amplifier comprises:
a first n-channel transistor having a gate connected to the second node and a source connected to the first node;
a second n-channel transistor having a gate connected to the first node, a drain connected to a drain of the first n-channel transistor, and a source connected to the second node;
a first p-channel transistor having a gate connected to the second node and a source connected to the first node; and
a second p-channel transistor having a gate connected to the first node, a drain connected to a drain of the first p-channel transistor, and a source connected to the second node.

25. The dynamic memory of claim 23 wherein the equilibrate circuit comprises:
a pre-charge node providing the pre-charge voltage;
a first n-channel transistor coupled between the pre-charge node and the first node; and
a second n-channel transistor coupled between the pre-charge node and the second node.

26. A method of sensing data stored in a plurality of dynamic memory cell capacitors, the method comprising:
equilibrating a sense amplifier circuit to a pre-charge voltage level that is equal to a ground potential, the sense amplifier circuit having a first node and a second node, the first node can be selectively connected to a single digit line through a first isolation transistor, the first isolation transistor having a first terminal connected to the first node and a second terminal source connected to the single digit line;
electrically isolating the second node of the sense amplifier;
coupling dummy memory cells to the second node; and
sensing the data stored in a dynamic memory cell capacitor using the sense amplifier circuit.

27. The method of claim 26 wherein sensing the data stored in the dynamic memory cell capacitor further comprises:
selectively connecting a dynamic memory cell capacitor to the single digit line;
providing an isolation signal to a gate of the first isolation transistor to electrically isolate the first node of the sense amplifier circuit from the single digit line; and
using the sense amplifier circuit, sensing a differential voltage between the first node and the second node.

28. The method of claim 26 wherein the sense amplifier circuit comprises a p-sense circuit and an n-sense circuit and the differential voltage between the first node and the second node is sensed by activating the p-sense circuit prior to activating the n-sense circuit.

29. A method of sensing data stored in a plurality of dynamic memory cell capacitors, the method comprising in the order of:
equilibrating a sense amplifier circuit to a pre-charge voltage level that is equal to ground, the sense amplifier circuit having a first node and a second node;
electrically isolating the second node;
coupling a selected memory cell to the single digit line while the single digit line is coupled to the first node;
electrically isolating the single digit line from the first node;
coupling dummy memory cells to the second node;
activating a p-sense circuit of a differential sense amplifier coupled to the first and second node; and
activating an n-sense circuit of a differential sense amplifier coupled to the first and second node.

30. The method of claim 29 further comprises electrically coupling the single digit line to the first node after activating the n-sense circuit to re-write data to the selected memory cell.

31. An integrated circuit memory system comprising:
a processor; and
a memory device coupled to the processor, the memory device comprising,
a plurality of memory cell capacitors;
a plurality of access devices connected to the plurality of memory cell capacitors and a single digit line, each to selectively connect one of the plurality of memory cell capacitors to the single digit line;
a differential sense amplifier having first and second nodes;

an equilibrate circuit coupled to the differential sense amplifier to equilibrate the first and second nodes to a pre-charge voltage level that is equal to ground potential, the equilibrate circuit comprises a pre-charge node providing the pre-charge voltage, a first n-channel transistor coupled between the pre-charge circuit and the first node, and a second n-channel transistor coupled between the pre-charge circuit and the second node;

a first isolation transistor electrically located between the first node of the differential sense amplifier and the single digit line to selectively isolate the first node from the single digit line in response to a gate voltage; and dummy cells selectively couplable to the second node of the differential sense amplifier.

* * * * *

UNITED STATES PATENT AND TRADEMARK OFFICE
CERTIFICATE OF CORRECTION

PATENT NO.   : 6,301,175 B1
DATED        : October 9, 2001
INVENTOR(S)  : Mirmajid Seyyedy and Brian M. Shirley It is certified that error appears in the above-identified patent and that said Letters Patent is hereby corrected as shown below:

Column 1,
Line 64, delete "a" after "describe".

Column 4,
Line 2, insert -- , -- after "capacitor".
Line 3, insert -- , -- after "example".
Line 6, insert -- , -- after "un-charged".
Line 7, insert -- , -- after "example".
Line 67, insert -- , -- after "126".

Column 5,
Line 24, delete "cell, typically" and insert -- cell. Typically --, therefor.
Line 64, delete "a" after "avoided." and insert -- A --, therefor.

Column 6,
Line 4, delete "a" after "Equil." and insert -- A --, therefor.
Line 22, insert -- , -- after "139".

Column 7,
Lines 19-22, delete "a boosted word line. Therefore, is required to couple a full memory cell charge to its associated digit line when low supply voltages are used." and insert -- "Therefore, a boosted word line is required to couple a full memory cell charge to its associated digit line when low supply voltages are used. --, therefor.
Line 47, delete "$_{vcc}$" and insert -- $V_{cc}$ --, therefor.
Line 54, delete "a" after "(SSPD)." and insert -- A --, therefor.

Column 8,
Line 29, delete "a" after "node." and insert -- A --, therefor.

UNITED STATES PATENT AND TRADEMARK OFFICE
CERTIFICATE OF CORRECTION

PATENT NO. : 6,301,175 B1
DATED : October 9, 2001
INVENTOR(S) : Mirmajid Seyyedy and Brian M. Shirley It is certified that error appears in the above-identified patent and that said Letters Patent is hereby corrected as shown below:

Column 12,
Line 64, delete "transistors" and insert -- transistor --, therefor.

Column 13,
Line 29, delete ";" between "the" and "first".

Signed and Sealed this

Seventh Day of May, 2002

Attest:

Attesting Officer

JAMES E. ROGAN
Director of the United States Patent and Trademark Office